(12) United States Patent
Wang et al.

(10) Patent No.: US 11,972,786 B2
(45) Date of Patent: Apr. 30, 2024

(54) FUNCTION SWITCHABLE MAGNETIC RANDOM ACCESS MEMORY AND METHOD FOR MANUFACTURING THE SAME

(71) Applicant: INSTITUTE OF SEMICONDUCTORS, CHINESE ACADEMY OF SCIENCES, Beijing (CN)

(72) Inventors: Kaiyou Wang, Bejing (CN); Yu Sheng, Beijing (CN)

(73) Assignee: INSTITUTE OF SEMICONDUCTORS, CHINESE ACADEMY OF SCIENCES, Beijing (CN)

(*) Notice: Subject to any disclaimer, the term of this patent is extended or adjusted under 35 U.S.C. 154(b) by 170 days.

(21) Appl. No.: 17/858,596

(22) Filed: Jul. 6, 2022

(65) Prior Publication Data

US 2023/0011349 A1   Jan. 12, 2023

(30) Foreign Application Priority Data

Jul. 7, 2021  (CN) .......................... 202110770061.6

(51) Int. Cl.
| | |
|---|---|
| *G11C 11/00* | (2006.01) |
| *G11C 11/16* | (2006.01) |
| *G11C 11/18* | (2006.01) |
| *H10N 50/85* | (2023.01) |
| *H10N 52/00* | (2023.01) |

(52) U.S. Cl.
CPC ............ *G11C 11/161* (2013.01); *G11C 11/18* (2013.01); *H10N 50/85* (2023.02); *H10N 52/00* (2023.02); *G11C 11/1695* (2013.01)

(58) Field of Classification Search
CPC .... G11C 11/161; G11C 11/18; G11C 11/1695
See application file for complete search history.

(56) References Cited

U.S. PATENT DOCUMENTS

| | | | | |
|---|---|---|---|---|
| 9,214,212 | B2* | 12/2015 | Yu ....................... | G11C 11/1675 |
| 11,150,312 | B2* | 10/2021 | Katti .................... | G01R 33/093 |
| 11,605,410 | B2* | 3/2023 | van 't Erve ......... | G11C 11/5607 |

* cited by examiner

*Primary Examiner* — Pho M Luu
(74) *Attorney, Agent, or Firm* — Christopher R. Christenson; Kelly, Holt & Christenson, P.L.L.C.

(57) ABSTRACT

Provided are a function switchable random access memory, including: two electromagnetic portions configured to connect a current; a magnetic recording portion between the two electromagnetic portions and including a spin-orbit coupling layer and a magnetic tunnel junction; a pinning region between each of the electromagnetic portions and the magnetic recording portion; a cut-off region on a side of each of the electromagnetic portions opposite to the pinning region, the spin-orbit coupling layer is configured to generate a spin current under an action of the current; the two electromagnetic portions is configured to generate two magnetic domains with magnetization pointing in opposite directions under an action of the spin current; the magnetic tunnel junction is configured to generate a magnetic domain wall based on the two opposite magnetic domains and is configured to drive the magnetic domain wall to reciprocate under the action of the spin current.

10 Claims, 2 Drawing Sheets

FUNCTION SWITCHABLE MAGNETIC RANDOM ACCESS MEMORY AND METHOD FOR MANUFACTURING THE SAME

CROSS-REFERENCE TO RELATED APPLICATION

This application claims the priority of Chinese Patent Application No. 202110770061.6 filed on Jul. 7, 2021 in the China National Intellectual Property Administration, the content of which is incorporated herein by reference in entirety.

TECHNICAL FIELD

The present disclosure relates to a field of data storage technology, and more particularly, to a function switchable random access memory and a method for manufacturing the same.

BACKGROUND

With the continuous development of information technology, the amount of data generated and relied on has increased explosively. A memory, as a data carrier, has thus been widely used. Performances of the memory include: write and read speed, power consumption, durability, storage density, and security.

A Spin-Orbit Torque Magnetic Random Access Memory (SOT-MRAM) is a magnetic random access memory that uses a magnetization to store information and spin orbit torque to write information, which has advantages of high-speed read/write capability, high integration, and near-infinite repeated writing. In this kind of memory, a spin current is generated by spin-orbit coupling, which in turn induce the magnetization switching of a magnet. However, the switching direction of the magnetization by pure spin orbit torque is random, and an in-plane magnetic field is usually in-demand for directional switching, which limiting the potential for applications. Besides, both memory and storage so far only have the rewritable function, and thus the stored information risks being tampered by hackers through internet, which cannot be fully resolved by encryption.

SUMMARY

The main purpose of the present disclosure is to provide a function switchable random access memory and a method for manufacturing the same.

In order to achieve the above purpose, a first aspect of the embodiments of the present disclosure provides a function switchable random access memory, including:

two electromagnetic portions configured to connect a current;

a magnetic recording portion disposed between the two electromagnetic portions, wherein the magnetic recording portion includes a spin-orbit coupling layer and a magnetic tunnel junction;

a pinning region disposed between each of the electromagnetic portions and the magnetic recording portion; and a cut-off region disposed on a side of each of the electromagnetic portions opposite to the pinning region, wherein the spin-orbit coupling layer is configured to generate a spin current under an action of the current;

wherein the two electromagnetic portions is further configured to generate two magnetic domains with magnetization pointing in opposite directions under an action of the spin current;

wherein the magnetic tunnel junction is configured to generate a magnetic domain wall based on the two magnetic domains with magnetization pointing in opposite directions; and wherein the magnetic tunnel junction is further configured to drive the magnetic domain wall to reciprocate under the action of the spin current, so as to achieve the switching of magnetization.

In an embodiment of the present disclosure, the magnetic tunnel junction includes: a first magnetic layer, a barrier layer and a second magnetic layer;

the first magnetic layer is disposed on the spin-orbit coupling layer and configured to generate the magnetic domain wall;

the barrier layer is disposed on the first magnetic layer and forms a tunneling magnetoresistance between the first magnetic layer and the second magnetic layer; and the second magnetic layer is disposed on the barrier layer and configured to record a change in a magnetism of the first magnetic layer.

In an embodiment of the present disclosure, each of the first magnetic layer and the second magnetic layer has a perpendicular magnetic anisotropy.

In an embodiment of the present disclosure, the magnetic tunnel junction further includes:

a fixing layer disposed on the second magnetic layer and configured to fix a magnetization direction of the second magnetic layer.

In an embodiment of the present disclosure, a material of the spin-orbit coupling layer is a metal material or a topological insulator material with a spin-coupling effect.

In an embodiment of the present disclosure, the random access memory is U-shaped.

A second aspect of the embodiments of the present disclosure provides a method for manufacturing the random access memory, including:

providing a substrate;

growing a spin-orbit coupling layer, a first magnetic layer, a barrier layer and a second magnetic layer in sequence on the substrate;

etching two pinning regions, wherein a magnetic recording portion is disposed between the two pinning regions and electromagnetic portions are disposed on a side of the two pinning regions away from the magnetic recording portion;

etching two cut-off regions, wherein the electromagnetic portions are disposed between the two pinning regions and the two cut-off regions; and etching the second magnetic layer to form a magnetic tunnel junction.

In an embodiment of the present disclosure, after the growing a spin-orbit coupling layer, a first magnetic layer, a barrier layer and a second magnetic layer in sequence on the substrate, the method further includes:

etching the spin-orbit coupling layer, the first magnetic layer, the barrier layer and the second magnetic layer to form a U-shaped structure, wherein the U-shaped structure includes a curved part and two straight parts.

In an embodiment of the present disclosure, the etching two pinning regions, wherein a magnetic recording portion is disposed between the two pinning regions, and electromagnetic portions are disposed on a side of the two pinning regions away from the magnetic recording portion includes:

etching the two pinning regions at a junction of the curved part and the two straight parts of the U-shaped structure, wherein the curved part is the magnetic recording portion, and the two straight parts are the electromagnetic portions.

In an embodiment of the present disclosure, the etching two cut-off regions, wherein the electromagnetic portions are disposed between the two pinning regions and the two cut-off regions includes:

etching the two cut-off regions at an end part of the two straight parts of the U-shaped structure, wherein the two opposite parts are the electromagnetic portions, and the end part is an end of the two electromagnetic portions away from the pinning regions.

BRIEF DESCRIPTION OF THE DRAWINGS

In order to more clearly explain the embodiments of the present disclosure or the technical solutions in the prior art, the accompanying drawings required in the description of the embodiments or the prior art will be briefly introduced below. Obviously, the accompanying drawings in the following description are only some embodiments of the present disclosure. For those skilled in the art, other accompanying drawings may be obtained without any creative effort based on these drawings.

DETAILED DESCRIPTION OF EMBODIMENTS

Figure 1:
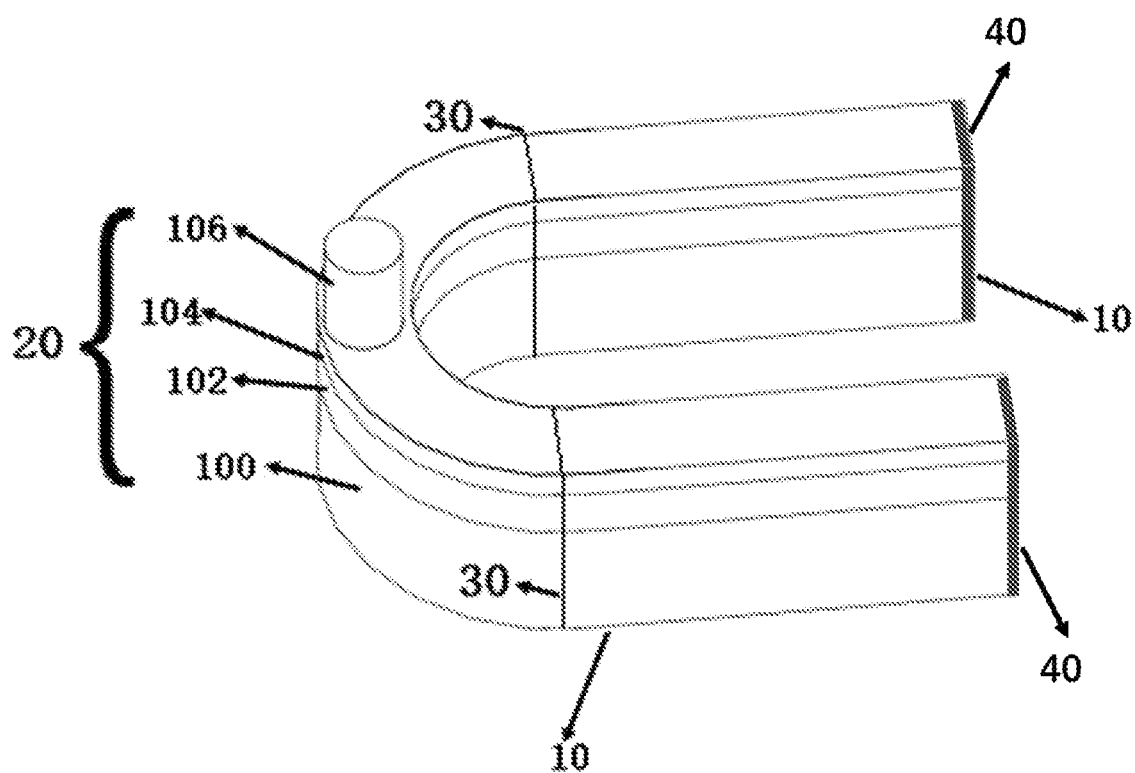
FIG. 1 shows a schematic structural diagram of a function switchable random access memory according to an embodiment of the present disclosure.

In order to make the disclosed purposes, features and advantages of the present disclosure more obvious and understandable, the technical solution in the embodiments of the present disclosure will be described clearly and completely below with reference to the accompanying drawings in the embodiments of the present disclosure. Obviously, the embodiments described above are only a part of the embodiments of the present disclosure, but not all of the embodiments. Based on the embodiments of the present disclosure, all other embodiments obtained by those skilled in the art without any creative effort should fall within the scope of protection of the present disclosure.

The present disclosure will be described in detail with reference to schematic diagrams. When the embodiments of the present disclosure are described in detail, for the convenience of explanation, a sectional view showing a device structure will not be partially enlarged according to the general scale. The schematic diagrams are only examples and are not intended to limit the scope of protection of the present disclosure. In addition, a three-dimensional spatial dimension of length, width and depth should be included in an actual production.

As described in the background section, a magnetic random access memory based on spin orbit torque has the advantages of high-speed read/write capability, high integration, and near-infinite repeated writing. However, Till now, an in-plane magnetic field is needed to break the symmetry to realize pure spin orbit torque induced magnetization switching. In addition, data security is crucial for end-users in the information era. Thus, an approach to achieve magnetic-field-free spin orbit torque-induced magnetization switching as well as function of data protection, is highly desired.

The present disclosure provides a function switchable random access memory and a method for manufacturing the same. The function switchable random access memory includes not only the rewritable function, but also the read-only function, allowing end-users to store their information in rewritable or read-only state at bit-level according to their own wishes.

Therefore, the present disclosure provides a random access memory including two electromagnetic portions, a magnetic recording portion disposed between the two electromagnetic portions, wherein the magnetic recording portion includes a spin-orbit coupling layer and a magnetic tunnel junction, a pinning region disposed between each of the electromagnetic portions and the magnetic recording portion, and a cut-off region disposed on a side of the electromagnetic portions away from the pinning region. When a current is applied to the random access memory, a spin current may be generated in the spin-orbit coupling layer, and a torque generated by the spin current may push a magnetic domain wall in the magnetic tunnel junction to move, which may cause the magnetization switching in the magnetic recording portion, and the switching direction may be controlled by a direction of the applied current. When the applied current of the electromagnetic portions is increased, the magnetic domain wall may be annihilated, so that the device may lose the capacity of current to erase and rewrite data, thereby switching an erasable and rewritable function to a read-only function.

Figure 2:
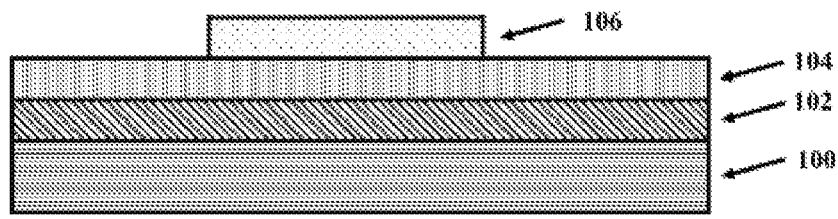
FIG. 2 shows a schematic cross-sectional view of a function switchable random access memory according to an embodiment of the present disclosure.

Referring to FIG. 1, FIG. 1 shows a schematic diagram of a function switchable random access memory according to an embodiment of the present disclosure, and FIG. 2 shows a schematic cross-sectional view of a function switchable random access memory shown in FIG. 1 according to an embodiment of the present disclosure. The random access memory includes:

two electromagnetic portions 10 configured to connect a current;

a magnetic recording portion 20 disposed between the two electromagnetic portions 10, wherein the magnetic recording portion 20 includes a spin-orbit coupling layer 100 and a magnetic tunnel junction;

a pinning region 30 disposed between each of the electromagnetic portions 10 and the magnetic recording portion 20; and a cut-off region 40 disposed on a side of each of the electromagnetic portions 10 away from the pinning region 30, wherein the spin-orbit coupling layer 100 is configured to generate a spin current under an action of the current;

wherein the two electromagnetic portions 10 is further configured to generate two magnetic domains with magnetization pointing in opposite directions under an action of the spin current;

wherein the magnetic tunnel junction is configured to generate a magnetic domain wall based on the two magnetic domains with magnetization pointing in opposite directions; and wherein the magnetic tunnel junction is further configured to drive the magnetic domain wall to reciprocate under the action of the spin current, so as to achieve an magnetization switching.

In the present disclosure, a U shape of the random access memory is schematically described as an example. An arc part of the U shape is the electromagnetic portion 10, and a rectangular part is the magnetic recording portion 20. It may be understood that the random access memory may also have any other shape, for example, broken line, semicircle, etc.

In order to better understand the technical effect of the present disclosure, the principle of the magnetization switching of the random access memory shown in the embodiments of the present disclosure will be described below with reference to FIG. 1. When information is written into the random access memory, a current is applied into the spin-orbit coupling layer 100. Due to a spin Hall effect or Rashba effect, spin-up or spin-down electrons in the spin-orbit coupling layer 100 will accumulate at an interface between the spin-orbit coupling layer 100 and the magnetic tunnel junction, and the spin current will diffuse into the magnetic tunnel junction so as to move the magnetic domain wall of the first magnetic layer therein. The pinning region 30 disposed between each electromagnetic portion 10 and the magnetic recording portion 20 may stop the magnetic domain wall. At this time, when a reverse current is applied, the magnetic domain wall may move in an opposite direction and stop at another pinning region 30. A change in a direction of the current may achieve a reciprocating motion of the magnetic domain wall, and produce an effect of the magnetization switching. By applying a current that enables the magnetic domain wall to cross the pinning region 30 and move in the electromagnetic portion 30, the magnetic domain wall moves to the cut-off region 40 and finally annihilates, so that the device enters a read-only mode.

According to the present disclosure, when a current is applied into the spin-orbit coupling layer 100, a spin current may be generated in the spin-orbit coupling layer 100, and the generated spin-orbit coupling moment pushes the magnetic domain wall to move, so as to achieve the magnetization switching. The reversal direction may be controlled by a direction of the current, so that the magnetization switching in the random access memory can be achieved. When the current is further increased, the magnetic domain wall may be annihilated, so that the device may lose the capacity of current to erase and rewrite data, thereby switching an erasable and rewritable function to a read-only function.

In an embodiment of the present disclosure, the spin-orbit coupling layer 100 is made of a material with a spin-orbit coupling effect. The spin-orbit coupling layer 100 is a metal layer or topological insulator layer with a spin coupling effect. A material of the metal layer may be, for example, Ta, Pt, W, Hf, Ir, CuBi, CuIr or AuW, etc. A material of the topological insulator layer may be, for example, BiSn, SnTe, BiSe, etc. or one of other IVA, VA and VIA compounds. A material with a large spin-orbit coupling strength may be selected.

In an embodiment of the present disclosure, the magnetic tunnel junction includes: a first magnetic layer 102, a barrier layer 104 and a second magnetic layer 106. The first magnetic layer 102 is disposed on the spin-orbit coupling layer 100 and configured to generate the magnetic domain wall, the barrier layer 104 is disposed on the first magnetic layer 102 and configured to generate a tunneling magnetoresistance between the first magnetic layer 102 and the second magnetic layer 106, and the second magnetic layer 106 is disposed on the barrier layer 104 and configured to record a change in a magnetism of the first magnetic layer 102.

It may be understood that the current is applied into the spin-orbit coupling layer 100. Due to a spin Hall effect or Rashba effect, spin-up or spin-down electrons in the spin-orbit coupling layer 100 will accumulate at an interface between the spin-orbit coupling layer 100 and the first magnetic layer 102, and the spin current will diffuse into the first magnetic layer 102 so as to move the magnetic domain wall therein.

In an embodiment of the present disclosure, the first magnetic layer 102 and the second magnetic layer 106 have a perpendicular magnetic anisotropy.

In the present disclosure, ferromagnetic materials of the first magnetic layer 102 and the second magnetic layer 106 may be elemental ferromagnetic materials, alloyed ferromagnetic materials or magnetic metal oxides, for example, may be Co, Fe, CoFeB or FePt and other hard magnetic materials. According to specific needs, the first magnetic layer 102 and the second magnetic layer 106 may have the same or different materials.

In the present disclosure, the barrier layer 104 is located between the first magnetic layer 102 and the second magnetic layer 106, and may be made of a non-magnetic metal or insulating material. The non-magnetic metal may be, for example, Cu or Ag, and the insulating material may be, for example, Alumina, magnesium oxide or hafnium oxide, etc.

In an embodiment of the present disclosure, the magnetic tunnel junction may further include a fixing layer disposed on the second magnetic layer 106 and configured to fix a magnetization direction of the second magnetic layer 106, and the material thereof may be, for example, a CoPt multilayer film artificial antiferromagnetism, etc.

In a specific application, the above-mentioned random access memory may be arranged in an array form to form a SOT-MRAM array. The storage array may be independent or integrated in a device using the SOT-MRAM storage array, such as a processor, a dedicated integrated circuit or a system-on-chip, etc.

The random access memory and its principle of the embodiments of the present disclosure have been described in detail above. In addition, the present disclosure further provides a method for manufacturing the above-mentioned random access memory. Specific embodiments will be described in detail below with reference to flowchart 3.

Figure 3:
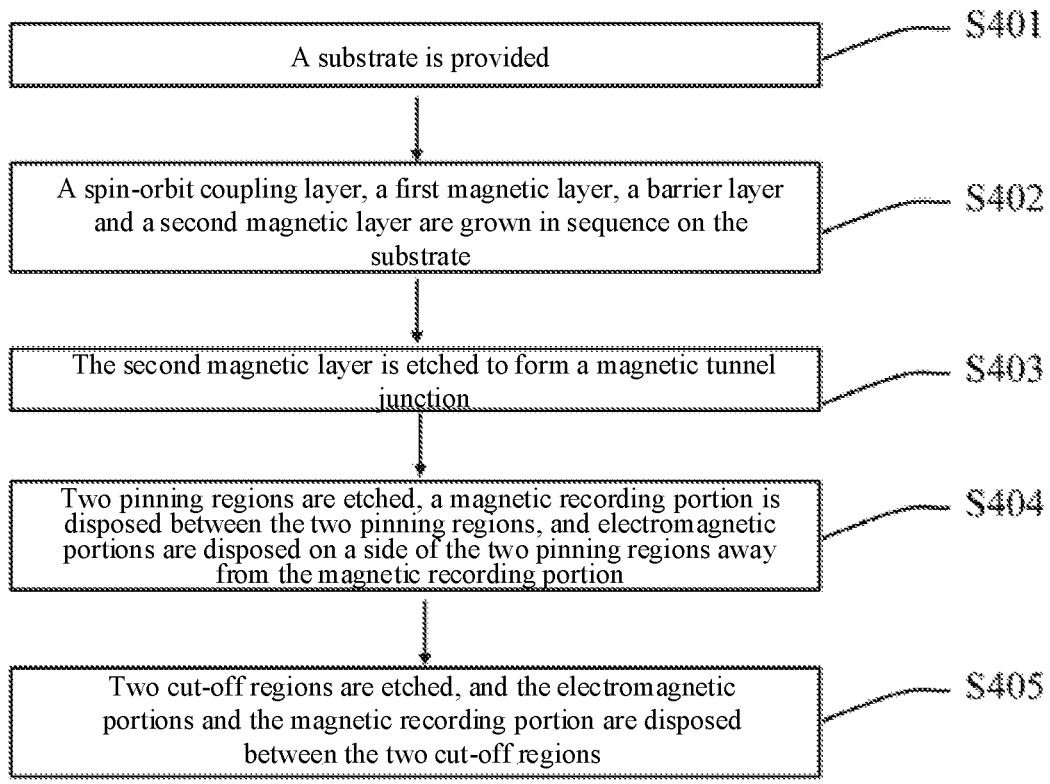
FIG. 3 shows a schematic flowchart of a method for manufacturing a function switchable random access memory according to an embodiment of the present disclosure.

Referring to FIG. 3, FIG. 3 shows a schematic diagram of a method for manufacturing a function switchable random access memory according to an embodiment of the present disclosure. The random access memory is the memory shown in FIG. 1 or FIG. 2. The method includes step S401 to step S405.

In S401, a substrate is disposed.

In S402, a spin-orbit coupling layer, a first magnetic layer, a barrier layer and a second magnetic layer are grown in sequence on the substrate.

In the present disclosure, a spin-orbit coupling layer made of a metal material such as Ta, Pt, etc. may be grown by a PVD (Physical Vapor Deposition) method, and a thickness thereof may be, for example, 3 nm to 5 nm. A spin-orbit coupling layer made of a topological insulator material such as BiSn, SnTe, etc. may also be grown by a MBE (Molecular Beam Epitaxy) method, and the thickness thereof may be, for example, 3 nm to 10 nm.

In the present disclosure, for example, the first magnetic layer, the barrier layer, and the second magnetic layer may be grown in sequence by a sputtering method or other suitable methods, and thicknesses thereof may be about 1 nm, 0.8 nm, and 1 nm in sequence. Subsequently, an etching is performed up to the substrate to form a U-shaped device.

In S403, the second magnetic layer is etched to form a magnetic tunnel junction.

In S404, two pinning regions are etched, a magnetic recording portion is disposed between the two pinning regions, and electromagnetic portions are disposed on a side of the two pinning regions away from the magnetic recording portion.

In the present disclosure, the formation method of the pinning regions includes ion etching, ion implantation, notch of geometric structure, localized heat treatment, etc.

In S405, two cut-off regions are etched, and the electromagnetic portions are disposed between the two cut-off regions and the two pinning regions.

In the present disclosure, the formation method of the cut-off regions includes ion etching, ion implantation, localized heat treatment, etc.

In the present disclosure, a thin film may be transformed into an arbitrary shape, such as a U-shaped thin film, by using photolithography and ion etching techniques. The U-shaped thin film includes a spin-orbit coupling layer, a first magnetic layer, a barrier layer and a second magnetic layer from bottom to top.

In the present disclosure, a processing of other components, such as protective layers, electrodes, etc., may also be performed as required.

It should be noted that, for the convenience of description, the above-mentioned method embodiments are all expressed as a series of action combinations. However, those skilled in the art should know that the present disclosure is not limited by the action sequences described above, because some steps may be performed in other sequences or simultaneously according to the present disclosure. Secondly, those skilled in the art should also know that the embodiments described in the description are all preferred embodiments, and the actions and modules involved are not necessarily all necessary to the present disclosure.

In the above-mentioned embodiments, the description of each embodiment has its own emphasis. For parts that are not described in detail in a certain embodiment, please refer to the relevant descriptions of other embodiments.

The above is a description of a function switchable random access memory and a method for manufacturing the function switchable random access memory disposed by the present disclosure. For those skilled in the art, according to the idea of the embodiments of the present disclosure, there will be changes in the specific implementation and the application range. In conclusion, the content of the description should not be construed as limiting the present disclosure.

What is claimed is:

1. A function switchable random access memory, comprising:
    two electromagnetic portions configured to connect a current;
    a magnetic recording portion disposed between the two electromagnetic portions, wherein the magnetic recording portion comprises a spin-orbit coupling layer and a magnetic tunnel junction;
    a pinning region disposed between each of the electromagnetic portions and the magnetic recording portion; and
    a cut-off region disposed on a side of each of the electromagnetic portions opposite to the pinning region,
    wherein the spin-orbit coupling layer is configured to generate a spin current under an action of the current;
    wherein the two electromagnetic portions is further configured to generate two magnetic domains with magnetization pointing in opposite directions under an action of the spin current;
    wherein the magnetic tunnel junction is configured to generate a magnetic domain wall based on the two magnetic domains with magnetization pointing in opposite directions; and
    wherein the magnetic tunnel junction is further configured to drive the magnetic domain wall to reciprocate under the action of the spin current, so as to achieve the magnetization switching.

2. The random access memory according to claim 1, wherein the magnetic tunnel junction comprises: a first magnetic layer, a barrier layer and a second magnetic layer;
    the first magnetic layer is disposed on the spin-orbit coupling layer and configured to generate the magnetic domain wall;
    the barrier layer is disposed on the first magnetic layer and configured to isolate the first magnetic layer and the second magnetic layer; and
    the second magnetic layer is disposed on the barrier layer and configured to record a change in a magnetism of the first magnetic layer.

3. The random access memory according to claim 2, wherein each of the first magnetic layer and the second magnetic layer has a perpendicular magnetic anisotropy.

4. The random access memory according to claim 1, wherein the magnetic tunnel junction further comprises:
    a fixing layer disposed on the second magnetic layer and configured to fix a magnetization direction of the second magnetic layer.

5. The random access memory according to claim 1, wherein a material of the spin-orbit coupling layer is a metal material or a topological insulator material with a spin-coupling effect.

6. The random access memory according to claim 1, wherein the random access memory is U-shaped.

7. A method for manufacturing the function switchable random access memory according to claim 1, comprising:
    providing a substrate;
    growing a spin-orbit coupling layer, a first magnetic layer, a barrier layer and a second magnetic layer in sequence on the substrate;
    etching two pinning regions, wherein a magnetic recording portion is disposed between the two pinning regions, and electromagnetic portions are disposed on a side of the two pinning regions away from the magnetic recording portion;
    etching two cut-off regions, wherein the electromagnetic portions are disposed between the two pinning regions and the two cut-off regions; and
    etching the second magnetic layer to form a magnetic tunnel junction.

8. The method according to claim 7, further comprising: after the growing a spin-orbit coupling layer, a first magnetic layer, a barrier layer and a second magnetic layer in sequence on the substrate,
    etching the spin-orbit coupling layer, the first magnetic layer, the barrier layer and the second magnetic layer to form a U-shaped structure, wherein the U-shaped structure comprises a curved part and two straight parts.

9. The method according to claim 7, wherein the etching two pinning regions, wherein a magnetic recording portion is disposed between the two pinning regions and electromagnetic portions are disposed on a side of the two pinning regions away from the magnetic recording portion comprises:
    etching the two pinning regions at a junction of the curved part and the two straight parts of the U-shaped structure, wherein the curved part is the magnetic recording portion, and the two straight parts are the electromagnetic portions.

10. The method according to claim 7, wherein the etching two cut-off regions, wherein the electromagnetic portions are disposed between the two pinning regions and the two cut-off regions comprises:
  etching the two cut-off regions at an end part of the two straight parts of the U-shaped structure, wherein the two straight parts are the electromagnetic portions, and the end part is an end of the two electromagnetic portions away from the pinning regions.

\* \* \* \* \*